United States Patent
Alpert et al.

(10) Patent No.: US 8,418,113 B1
(45) Date of Patent: Apr. 9, 2013

(54) CONSIDERATION OF LOCAL ROUTING AND PIN ACCESS DURING VLSI GLOBAL ROUTING

(75) Inventors: Charles J. Alpert, Austin, TX (US); Zhuo Li, Cedar Park, TX (US); Chin Ngai Sze, Austin, TX (US); Yaoguang Wei, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/252,067

(22) Filed: Oct. 3, 2011

(51) Int. Cl.
*G06F 17/50* (2006.01)

(52) U.S. Cl.
USPC .......................................... 716/129; 716/130

(58) Field of Classification Search ........... 716/126–131
See application file for complete search history.

(56) References Cited

U.S. PATENT DOCUMENTS

| | | | |
|---|---|---|---|
| 5,295,082 A | 3/1994 | Chang et al. | |
| 5,847,969 A | 12/1998 | Miller et al. | |
| 7,131,096 B1 * | 10/2006 | Balsdon et al. | 716/129 |
| 2001/0009031 A1 | 7/2001 | Nitta et al. | |
| 2004/0044979 A1 | 3/2004 | Aji et al. | |
| 2004/0098697 A1 * | 5/2004 | Frankle et al. | 716/13 |
| 2004/0098698 A1 * | 5/2004 | Teig et al. | 716/13 |
| 2006/0085769 A1 | 4/2006 | Bergeron et al. | |
| 2007/0136714 A1 | 6/2007 | Cohn et al. | |

OTHER PUBLICATIONS

Nieberg, Tim, "Gridless Pin Access in Detailed Routing," Proc. 48th Design Automation Conference (2011).

* cited by examiner

*Primary Examiner* — Binh Tat
(74) *Attorney, Agent, or Firm* — Dwayne Nelson; Jack V. Musgrove

(57) ABSTRACT

Global routing and congestion evaluation is enhanced by including consideration of local routing and pin access. Pin information is computed for each global edge based on adjacent tiles, and the wiring track capacity for an edge is reduced based on the pin information. After global routing, the wiring track capacities are increased by previous reduction amounts for detailed routing. The pin information can include pin count for an associated tile, the Steiner tree length for the pins, or relative locations of the pins. Wiring track capacities are preferably reduced by creating blockages in tracks of a particular metal layer of the circuit design used for logic gates of the pins. The blockage tracks can be spread evenly across the wiring tracks of a given edge.

24 Claims, 4 Drawing Sheets

US 8,418,113 B1

CONSIDERATION OF LOCAL ROUTING AND PIN ACCESS DURING VLSI GLOBAL ROUTING

BACKGROUND OF THE INVENTION

1. Field of the Invention

The present invention generally relates to the design and manufacture of integrated circuits, and more particularly to a method of global wire routing for an integrated circuit design.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins (connection points for the cell), each of which in turn may be connected to one or more other pins of the IC by wires. The wires connecting the pins of the IC are also formed on the surface of the chip. For more complex designs, there are typically at least four distinct layers of conducting media available for vertical and/or horizontal routing: the polysilicon layer, and the metal-1, metal-2, and metal-3 layers.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The process of converting the specifications of an electrical circuit into such a layout is called the physical design.

Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete.

Routability is a key factor when performing circuit floorplanning/placement or trying to close on timing via physical synthesis. A designer can expend considerable effort trying to get the design into a good state in terms of timing and signal integrity, only to subsequently find that it is unroutable. Ideally, the designer should be able to invoke a snapshot routability analysis that allows him or her to understand the routability issues involved from making floorplanning/placement or optimization decisions.

Routing is typically performed in two stages known as global routing and detailed routing. In global routing, the circuit design area is partitioned into a grid of rectangles referred to variously as bins, buckets, global cells (g-cells), grid cells, or tiles (referred to hereafter as tiles). FIG. 1 illustrates a simplified example of a circuit layout 2 having a plurality of cells 4. Layout 2 has been divided into a grid of 9×9 tiles 6 for global routing, and may additionally include various blockages 8 such as logic macros, proprietary circuit blocks (IP), or static random-access memory (SRAM). Each of the boundaries between adjacent tiles is referred to as a global edge (g-edge), and each global edge has wiring tracks for global interconnections, that is, connections between tiles without consideration of connections or pins inside a tile. Global routing also typically ignores details such as the exact geometry of each wire or pin. Most global routers first decompose every multi-pin net into a set of two-pin nets using a spanning tree or Steiner tree algorithm. After decomposition, each two-pin net is routed by maze routing or segment shifting. The capacity of a global edge represents the number of wiring tracks for the corresponding boundary, and the overflow of an edge is defined as the how much the routing demand exceeds the edge capacity (the global router may end up assigning too many connections to an edge). The primary objective of global routing is accordingly to minimize the total overflow across all g-edges in the grid Global routing is followed by detailed routing, which completes point-to-point connections between pins within each cell, specifying geometric information of the wires such as wire width and layer assignments.

SUMMARY OF THE INVENTION

The present invention is directed to a method of establishing global wiring connections for an integrated circuit design, by receiving a description of the circuit design including pin locations and interconnections, partitioning the circuit design into a plurality of global tiles having one or more global edges wherein each global edge has wiring tracks and a wiring track capacity, computing pin information for each global edge, reducing the wiring track capacity for a given global edge based on associated pin information, and routing global connections between tiles using the reduced wiring track capacities. After the global routing, the current wiring track capacities can be increased by previous reduction amounts for detailed routing of connections between pins. In one embodiment the pin information includes a pin count n for the tile(s) associated with the given global edge, and the wiring track capacity is reduced by an amount k×n, where k is a user-defined parameter. In another embodiment the pin information includes a Steiner tree length for pins in the tile(s) associated with the given global edge, and the wiring track capacity is reduced by an amount proportional to the Steiner tree length. In still another embodiment the pin information includes relative pin locations of pins in a tile associated with the given global edge, and the wiring track capacity is reduced based on the relative pin locations. For adjacent tiles, pin information can include first pin information for the first tile and second pin information for the second tile, and the wiring track capacity is reduced by a first amount based on the first pin information and by a second amount based on the second pin information. The wiring track capacities can be reduced by creating blockages in the wiring tracks of a particular metal layer of the circuit design used for logic gates of pins. The blockage tracks can be spread evenly across the wiring tracks of the given global edge.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Global routing by its nature cannot consider local routing and pin access problems that arise during detailed routing. It is not feasible to perform global routing and detailed routing simultaneously, as the CPU run time (computational cost) would be excessively high, so it is not practical for real industrial use. This limitation often results in an unacceptable discrepancy between congestion after global routing and routing errors after detailed routing, including "opens" wherein pins are left without a sufficient number of connections, and "shorts" wherein multiple pin connections are improperly assigned to a single wiring track. Global routing congestion analysis is fairly inaccurate and overly optimistic. A good global routing should predict the opens/shorts seen after detailed routing, but this is rarely the case. It would therefore be desirable to devise an improved global routing method which could consider intra-tile (local) routing and pin access such that the congestion hotspots reported by global routing match the open/short errors at the end of detailed routing. At the same time, the efficiency (computational cost) of global routing has to be maintained.

The present invention recognizes that each pin in a tile will likely require wires connecting to it, and accordingly uses pin information during the global routing process. The number and locations of pins in a tile can be good indicators of the local routing resource consumption, and the invention allows these parameters to be used in creating blockage tracks along the global edges. The blockage tracks are temporary blockages created during global routing that are then removed for detailed routing so increased wire track capacities now become available, thereby reducing the likelihood of open/short errors. The invention may be implemented without significantly slowing global routing, and further may result in decreased detailed routing time due to better handling of routing demand.

Figure 1:
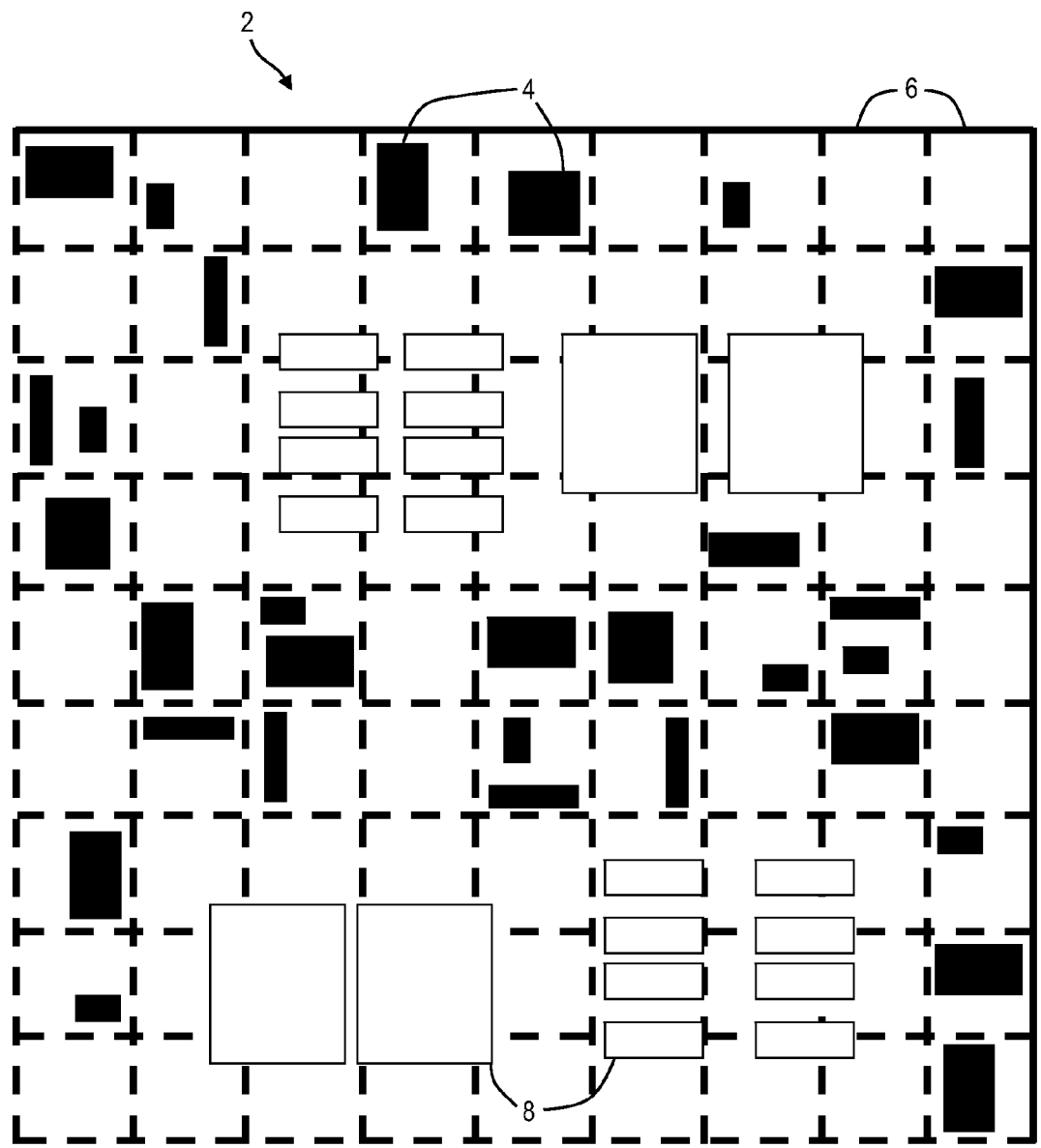
FIG. 1 is a plan view of a simplified integrated circuit layout which has been divided into a grid of tiles according to conventional global routing techniques.
Figure 2:
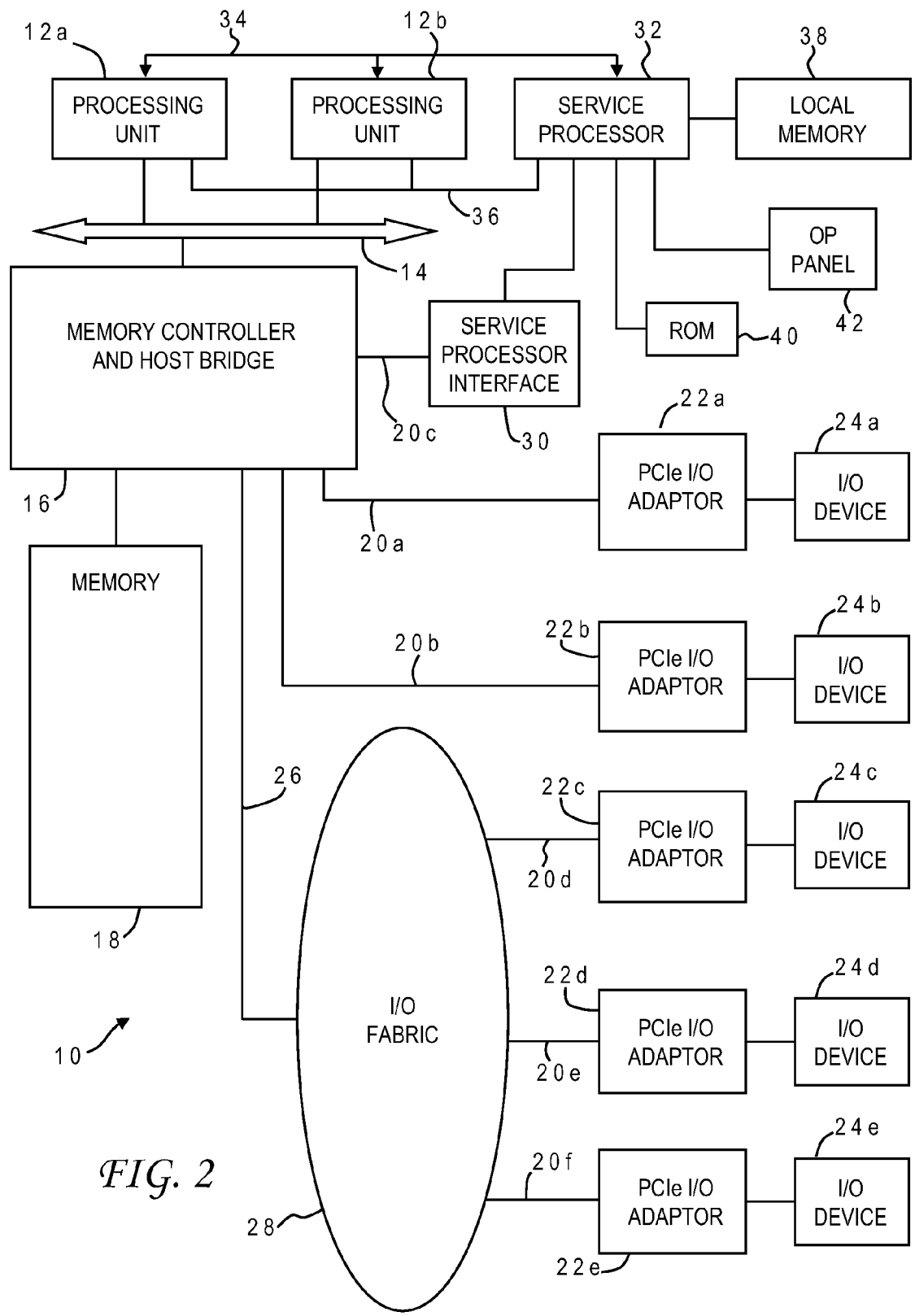
FIG. 2 is a block diagram of a computer system programmed to carry out routing for an integrated circuit design in accordance with one implementation of the present invention.

With reference now to the figures, and in particular with reference to FIG. 2, there is depicted one embodiment 10 of a computer system in which the present invention may be implemented to carry out the design of logic structures in an integrated circuit, including wire routing. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12a, 12b may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20c connects MC/HB 16 to a service processor interface 30 to allow communications between I/O device 24a and a service processor 32. Service processor 32 is connected to processors 12a, 12b via a JTAG interface 34, and uses an attention line 36 which interrupts the operation of processors 12a, 12b. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12a, 12b and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12a, 12b for execution of the program code, e.g., an operating system (OS) which is used to launch applications and in particular the circuit design routing application of the present invention, results of which may be stored in a hard disk drive of the system (an I/O device 24). While host processors 12a, 12b are executing program code, service processor 32 may enter a mode of monitoring and reporting any operating parameters or errors, such as the cooling fan speed and operation, thermal sensors, power supply regulators, and recoverable and non-recoverable errors reported by any of processors 12a, 12b, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for an integrated circuit design process that uses novel global routing techniques to manage wire congestion. Accordingly, a program embodying the invention may include conventional aspects of various design, routing and analysis tools, and these details will become apparent to those skilled in the art upon reference to this disclosure.

Figure 3A:
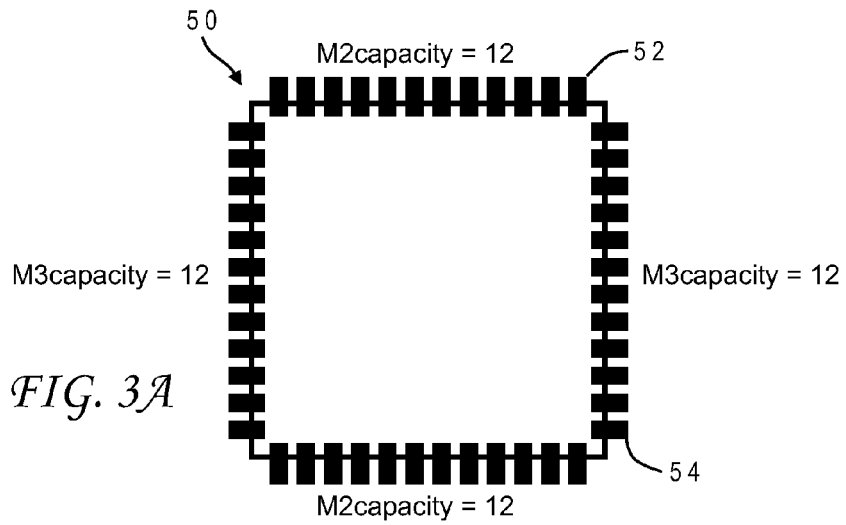
FIGS. 3A-3C are plan views of a global tile whose edge wire capacities are reduced based on pin information in accordance with one implementation of the present invention.
Figure 3B:
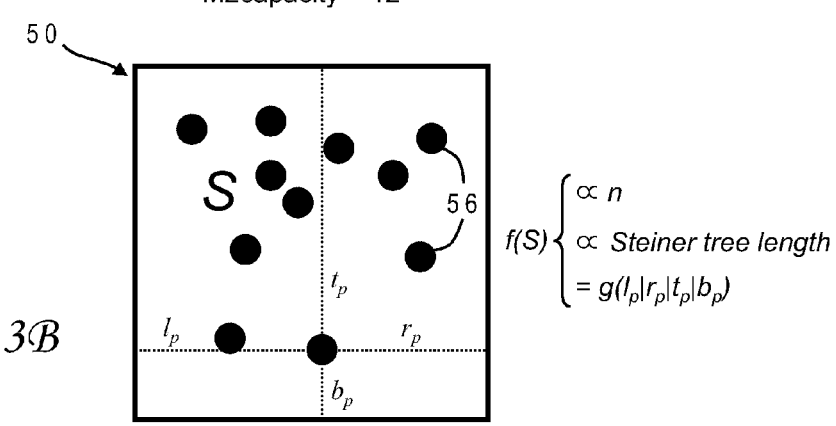
Figure 3C:
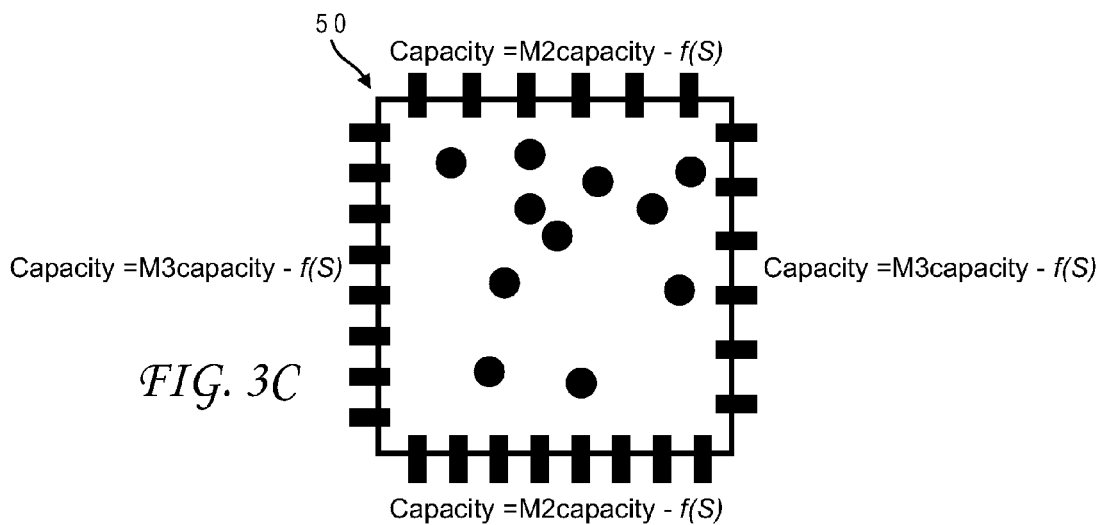

Referring now to FIGS. 3A-3C, there is depicted one example of a tile 50 of an integrated circuit design partitioned for global routing in accordance with the present invention. In this example the height and width of the tiles are the same, but the invention can be used for other aspect ratios, and even for non-rectangular shapes (e.g., triangular, parallelogram or hexagonal). The size of tile 50 can be varied to trade off speed for solution quality. As seen in FIG. 3A, the top and bottom global edges of tile 50 are routed using the metal-2 layer, with twelve available vertical tracks 52, i.e., M2capacity=12, and the left and right global edges of tile 50 are routed using the metal-3 layer, also with twelve available horizontal tracks 54, i.e., M3capacity=12. The M2 and M3 layers are selected because in many designs the pins of the logic gates in the design library are mostly on M2, with some on M3.

FIG. 3B shows the placement of a set S of eleven pins 56. The relative location of a given pin p within a tile can be denoted by the distances $l_p$, $r_p$, $t_p$, $b_p$, between the left, right, top or bottom border. The present invention creates routing blockages based on computed pin information which may include the number of pins in the associated tile (pin density or pin count), the length of Steiner trees for selected pins in the tile (the Steiner tree is a known construct used in circuit design), or the pin locations. The routing blockages are created by adjusting the track capacities according to the function $f(S)$, i.e., the new capacity of the top or bottom edges will be M2capacity−$f(S)$, and the new capacity of the left and right edges will be M3capacity−$f(S)$. In one implementation, $f(S)$ k×n, where n is the number of pins in S, and k is a user-defined parameter. The value of k may be technology-dependent; exemplary values are k=0.1 for cu32 technology, or k=0.04 for cu45 technology. In another implementation, $f(S)$ is based on the length of the Steiner trees for subsets of the pins in S, i.e., blockages for horizontal tracks (along a vertical edge) are based on the horizontal Steiner tree segment lengths, and blockages for vertical tracks (along a horizontal edge) are based on the vertical Steiner tree segment lengths. In particular, the blockage may be equal to the total horizontal or vertical segment length divided by the tile size. In yet another implementation, $f(S)$ is a function of the pin locations relative to the edge, i.e., $g(l_p|r_p|t_p|b_p)$. In particular, the blockage may be the product of the user-defined parameter k times the sum of differences between the tile size and the distance from each pin to the edge, divided by the tile size, or $$f(S) = k \sum_p [(w - d_p)/w],$$

where w is the tile size, and $d_p$ is the distance from pin p to the edge (note that w−$d_p$=w if the pin is at the same edge, and w−$d_p$=0 if the pin is at the opposite edge across the tile). The adjustment value $f(S)$ may further be a combination of any of the foregoing three functions, or based on other factors relating to local routing. The reduction amount can be spread evenly across the geometry of the global edge, i.e., evenly spaced blockage tracks.

A common edge between adjacent tiles (horizontal or vertical) can use pin information from both tiles, i.e., if the set of pins in one tile is $S_1$ and the set of pins in the other tile is $S_2$, then the final capacity of that edge will be NewCapacity=OriginalCapacity−$f(S_1)$−$f(S_2)$.

Figure 4:
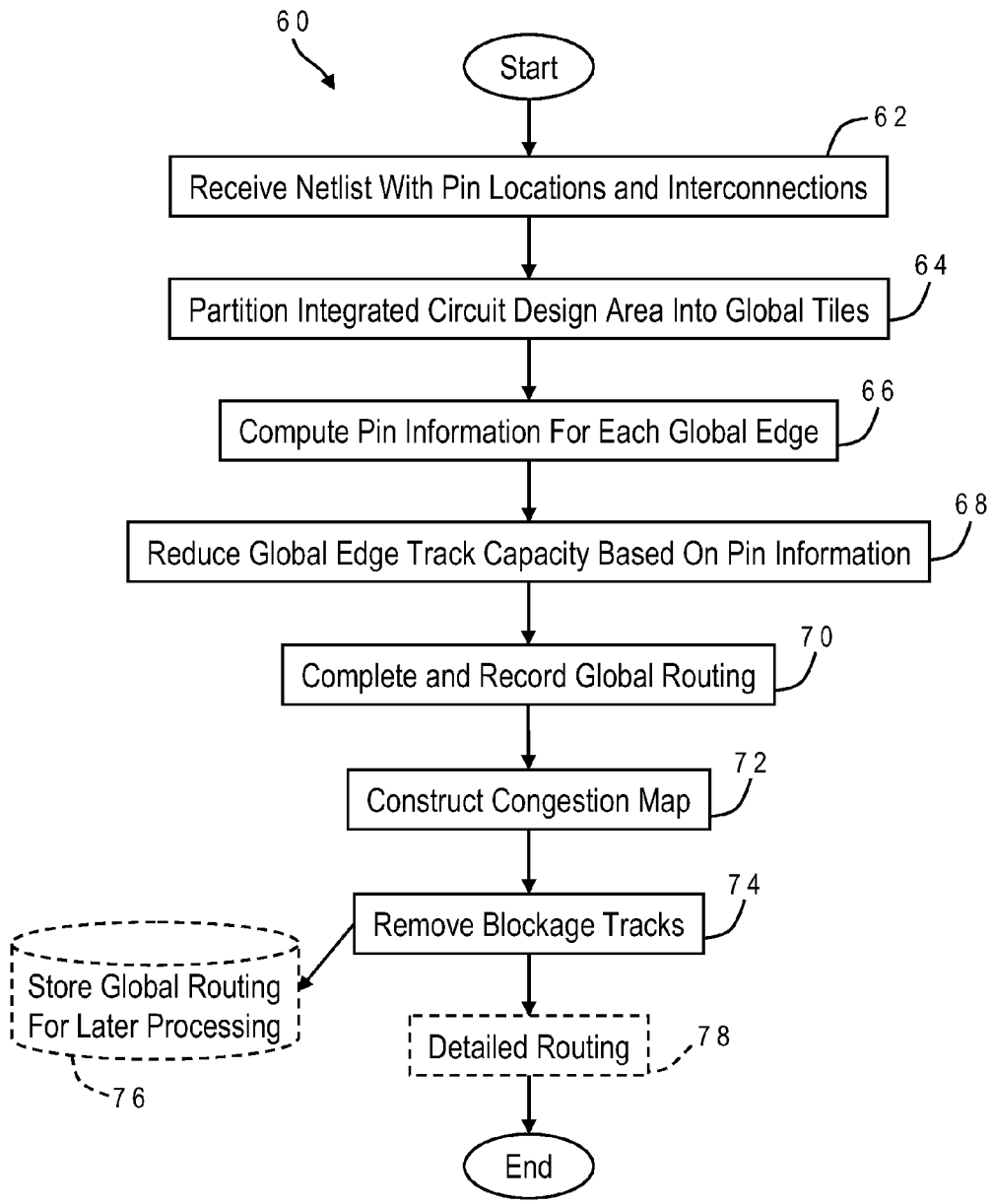
FIG. 4 is a chart illustrating the logical flow for a global routing process which includes consideration of local routing and pin access in accordance with one implementation of the present invention.

The invention may be further understood with reference to FIG. 4 which illustrates the logical flow for a global routing process 50 in accordance with one embodiment of the present invention. The process begins when computer system 10 receives a description of the placed circuit with pin locations and interconnections 62, e.g., a netlist. The circuit design area is partitioned into a grid of rectangular tiles defining global edges 64. Pin information is then computed for each global edge based on pins in associated tiles 66. The wiring track capacity of an edge is reduced based on its pin information 68, e.g., pin density, Steiner tree length, or relative pin locations. Global routing is then completed according to conventional methods 70, for example, segment shifting, multi-pin decomposition and maze routing in 2D or 3D. After global routing is complete, the global routes are recorded, and a congestion map can be constructed to evaluate the physical design quality, and make design decisions no floorplanning/placement 72. Once all of the routing/congestion information has been collected, the blockage tracks are removed 74, i.e., the current capacities of the global edges are increased by the previous reductions. The process 60 is essentially complete at this point, and the globally routed design may be stored for further processing 76, or may proceed to detailed routing 78. The flow of FIG. 4 could be repeated on different versions of the same circuit design as part of a larger iterative design process, e.g., physical synthesis.

The present invention thereby enhances global routing and congestion evaluation at low computational cost, leading to fewer iterations between floorplanning/placement and routing, and to faster detailed routing, and can be easily implemented. The benefits are such that the global routing time itself may be reduced by using a larger tile size, while still retaining a quality solution. Congestion analysis and global routing is greatly improved, which helps guide routing congestion mitigation transforms such as congestion-driven placement. The invention is also very scalable.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of establishing global wiring connections for an integrated circuit design, comprising:
 receiving a description of the circuit design including pin locations and interconnections, by executing first instructions in a computer system;
 partitioning the circuit design into a plurality of global tiles having one or more global edges defined by boundaries between adjacent global tiles, each global edge having wiring tracks and a wiring track capacity, by executing second instructions in the computer system;

computing pin information for a given global edge based on pins located within at least one tile associated with the given global edge, by executing third instructions in the computer system;

reducing the wiring track capacity for the given global edge based on associated pin information to yield reduced wiring track capacities, by executing fourth instructions in the computer system; and routing global connections between tiles using the reduced wiring track capacities, by executing fifth instructions in the computer system.

2. The method of claim 1, further comprising:

after said routing global connections, increasing current wiring track capacities of the global edges by previous reduction amounts to yield increased wiring track capacities; and routing detailed connections between pins using the increased wiring track capacities.

3. The method of claim 1 wherein:

said computing pin information includes computing a pin count n for the tile associated with the given global edge; and the wiring track capacity is reduced by an amount k×n, where k is a user-defined parameter.

4. The method of claim 1 wherein:

said computing pin information includes computing a set of Steiner tree lengths for a subset of pins in the tile associated with the given global edge; and the wiring track capacity is reduced by an amount proportional to a sum of the Steiner tree lengths.

5. The method of claim 1 wherein:

said computing pin information includes computing relative pin locations of pins in the tile associated with the given global edge; and the wiring track capacity is reduced based on the relative pin locations.

6. The method of claim 1 wherein:

said computing pin information includes computing first pin information for a first tile adjacent the given global edge and computing second pin information for a second tile adjacent the given global edge; and said reducing reduces the wiring track capacity for the given global edge by a first amount based on the first pin information and by a second amount based on the second pin information.

7. The method of claim 1 wherein said reducing creates blockages in the wiring tracks of a set of particular metal layers of the circuit design used for logic gates of pins.

8. The method of claim 1 wherein said reducing spreads blockage tracks evenly across the wiring tracks of the given global edge.

9. A computer system comprising:

one or more processors which process program instructions;

a memory device connected to said one or more processors; and program instructions residing in said memory device for establishing global wiring connections for an integrated circuit design, by receiving a description of the circuit design including pin locations and interconnections, partitioning the circuit design into a plurality of global tiles having one or more global edges defined by boundaries between adjacent global tiles wherein a given global edge has wiring tracks and a wiring track capacity, computing pin information for each global edge based on pins located within at least one tile associated with the given global edge, reducing the wiring track capacity for the given global edge based on associated pin information to yield reduced wiring track capacities, and routing global connections between tiles using the reduced wiring track capacities.

10. The computer system of claim 9 wherein said program instructions further increase current wiring track capacities of the global edges by previous reduction amounts after routing the global connections, to yield increased wiring track capacities, and route detailed connections between pins using the increased wiring track capacities.

11. The computer system of claim 9 wherein the pin information includes a pin count n for the tile associated with the given global edge, and the wiring track capacity is reduced by an amount k×n, where k is a user-defined parameter.

12. The computer system of claim 9 wherein the pin information includes a set of Steiner tree lengths for a subset of pins in the tile associated with the given global edge, and the wiring track capacity is reduced by an amount proportional to a sum of the Steiner tree lengths.

13. The computer system of claim 9 wherein the pin information includes relative pin locations of pins in the tile associated with the given global edge, and the wiring track capacity is reduced based on the relative pin locations.

14. The computer system of claim 9 wherein the pin information includes first pin information for a first tile adjacent the given global edge and second pin information for a second tile adjacent the given global edge, and the wiring track capacity for the given global edge is reduced by a first amount based on the first pin information and by a second amount based on the second pin information.

15. The computer system of claim 9 wherein the wiring track capacity for the given global edge is reduced by creating blockages in the wiring tracks of a set of particular metal layers of the circuit design used for logic gates of pins.

16. The computer system of claim 9 wherein the wiring track capacity for the given global edge is reduced by spreading blockage tracks evenly across the wiring tracks of the given global edge.

17. A computer program product comprising:

a computer-readable storage medium; and program instructions residing in said storage medium for establishing global wiring connections for an integrated circuit design, by receiving a description of the circuit design including pin locations and interconnections, partitioning the circuit design into a plurality of global tiles having one or more global edges defined by boundaries between adjacent global tiles wherein a given global edge has wiring tracks and a wiring track capacity, computing pin information for each global edge based on pins located within at least one tile associated with the given global edge, reducing the wiring track capacity for the given global edge based on associated pin information to yield reduced wiring track capacities, and routing global connections between tiles using the reduced wiring track capacities.

18. The computer program product of claim 17 wherein said program instructions further increase current wiring track capacities of the global edges by previous reduction amounts after routing the global connections, to yield increased wiring track capacities, and route detailed connections between pins using the increased wiring track capacities.

19. The computer program product of claim 17 wherein the pin information includes a pin count n for the tile associated with the given global edge, and the wiring track capacity is reduced by an amount k×n, where k is a user-defined parameter.

20. The computer program product of claim 17 wherein the pin information includes a set of Steiner tree lengths for a subset of pins in the tile associated with the given global edge, and the wiring track capacity is reduced by an amount proportional to a sum of the Steiner tree lengths.

21. The computer program product of claim 17 wherein the pin information includes relative pin locations of pins in the tile associated with the given global edge, and the wiring track capacity is reduced based on the relative pin locations.

22. The computer program product of claim 17 wherein the pin information includes first pin information for a first tile adjacent the given global edge and second pin information for a second tile adjacent the given global edge, and the wiring track capacity for the given global edge is reduced by a first amount based on the first pin information and by a second amount based on the second pin information.

23. The computer program product of claim 17 wherein the wiring track capacity for the given global edge is reduced by creating blockages in the wiring tracks of a set of particular metal layers of the circuit design used for logic gates of pins.

24. The computer program product of claim 17 wherein the wiring track capacity for the given global edge is reduced by spreading blockage tracks evenly across the wiring tracks of the given global edge.

* * * * *